(12) United States Patent
Hong

(10) Patent No.: US 7,309,634 B2
(45) Date of Patent: Dec. 18, 2007

(54) NON-VOLATILE SEMICONDUCTOR MEMORY DEVICES USING PROMINENCES AND TRENCHES

(75) Inventor: Seung-Wan Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 11/303,360

(22) Filed: Dec. 16, 2005

(65) Prior Publication Data
US 2006/0141706 A1    Jun. 29, 2006

(30) Foreign Application Priority Data
Dec. 28, 2004  (KR)  ............... 10-2004-0113977

(51) Int. Cl.
*H01L 21/336*  (2006.01)
(52) U.S. Cl. ............... 438/288; 438/506; 257/E21.17; 257/E21.051; 257/E21.4; 257/E21.32; 257/E21.249; 257/E21.655
(58) Field of Classification Search ............... 257/288, 257/68, 192, 213, 240, 260, 296, 347, 350, 257/506, 760
See application file for complete search history.

(56) References Cited

U.S. PATENT DOCUMENTS

| 5,753,951 | A | 5/1998 | Geissler |
| 5,889,304 | A | 3/1999 | Watanabe et al. |
| 6,114,204 | A * | 9/2000 | Ding et al. ............... 438/264 |
| 6,200,856 | B1 * | 3/2001 | Chen ............... 438/257 |
| 6,255,689 | B1 * | 7/2001 | Lee ............... 257/314 |
| 6,413,802 | B1 * | 7/2002 | Hu et al. ............... 438/151 |
| 6,657,252 | B2 | 12/2003 | Fried et al. |
| 6,768,158 | B2 | 7/2004 | Lee et al. |

FOREIGN PATENT DOCUMENTS

| JP | 8-88285 A | 4/1996 |
| JP | 10-22403 A | 1/1998 |
| KR | 10-0234508 B1 | 9/1999 |
| KR | 1999-0075210 A | 10/1999 |

* cited by examiner

*Primary Examiner*—David Nhu
(74) *Attorney, Agent, or Firm*—Myers Bigel Sibley & Sajovec, P.A.

(57) ABSTRACT

A semiconductor substrate is patterned to form a depression and prominence. A floating gate is formed so as to cover at least both sidewalls of the prominence of the depression and prominence, and is then etched to form a trench for a device isolation self-aligned with the floating gate. Related structures are also described.

10 Claims, 19 Drawing Sheets

NON-VOLATILE SEMICONDUCTOR MEMORY DEVICES USING PROMINENCES AND TRENCHES

CROSS-REFERENCE TO RELATED APPLICATION

This application claims the benefit under 35 USC §119 of Korean Patent Application No. 10-2004-0113977, filed on Dec. 28, 2004, the disclosure of which is hereby incorporated herein by reference in its entirety as if set forth fully herein.

FIELD OF THE INVENTION

The present invention relates to semiconductor devices and methods of forming the same, and more particularly, to non-volatile semiconductor memory devices and methods of forming the same.

BACKGROUND OF THE INVENTION

Silicon-based integrated circuit (IC) devices, in particular, a metal-oxide semiconductor (MOS) device, e.g., a field effect transistor (FET) or a metal-oxide semiconductor field effect transistor (MOSFET) are widely used in many consumer and commercial applications. These devices have been fabricated such that the throughput can decrease and a high speed, a high integrity and an enhanced performance can be obtained.

FIG. 1A shows a conventional planar type FET. Referring to FIG. 1A, the planar type FET is formed on a substrate 10 having heavily doped source (S) and drain (D) regions 12 separated by a lightly doped channel region 18. Halo regions 20 also may be provided. The channel region 18 is controlled by a gate electrode 14 electrically isolated from the channel region 18 by a gate insulating layer 16.

As the integration density continues to increase, a variety of problems deteriorating the transistor characteristics may occur. For instance, as the channel length of the FET is gradually decreased, problems including short channel effects, such as punch-through, drain induced barrier lowering (DIBL), subthreshold swing and the like, an increase in parasitic capacitance (junction capacitance) between the junction region and a substrate, a leakage current increase, etc., may occur.

Accordingly, a variety of structures, processes and equipment to replace the conventional planar type FET have been developed. For example, a variety of transistors including an ultra-thin body transistor in which a channel region 18 is disposed in an ultra thin layer 12 as shown in FIG. 1B, and a double-gate transistor having one channel region 18 controlled by two gates 14a and 14b separated from the channel region 18 by gate insulating layers 16a and 16b as shown in FIG. 1C, have been designed and proposed to overcome the potential problems of the conventional planar type bulk-FET.

A FinFET process, in which a channel is formed in a semiconductor "Fin", a gate insulating layer is formed on the semiconductor Fin, and a gate electrode is formed around the semiconductor Fin has also been proposed. FIGS. 2A and 2D show sectional views of semiconductor substrates used in main steps of a conventional method of forming a conventional Fin transistor using a bulk silicon substrate.

First, referring to FIG. 2A, a silicon substrate exposed by an etch mask 13 formed thereon is anisotropically etched to form a silicon fin 15. The etch mask is generally formed of silicon nitride. At this time, a thermal oxide may be formed between the silicon nitride and the silicon substrate. Thereafter, a device isolation layer 17 is formed for an electrical insulation between adjacent silicon fins, as shown in FIG. 2B.

Referring to FIG. 2C, the device isolation layer 17 is partially removed such that sidewalls of the silicon fin 15, which are being used as an active region, are exposed. The exposed sidewalls of the silicon fin 15 serve as a channel region.

Referring to FIG. 2D, a gate insulating layer 19 is formed on the exposed sidewalls of the fin 15, and then a gate electrode 21 is also formed. As a result, a double-gate FinFET in which both sidewalls of the silicon fin 15 are controlled by the gate electrode 21 is formed.

According to the conventional method of forming the double-gate FinFET, while the step of partially removing the device isolation layer 17 is performed, a junction between the etch mask 13 and the substrate 10 may be weakened. Since the device isolation layer 17 may be an oxide-based insulator, the thermal oxide of the etch mask 13 on some of the semiconductor fins may be removed together with the device isolation layer. Especially, as the device is highly integrated and the width of the semiconductor fin decreases, the possibility that the etch mask 13 is detached from surfaces of some of the semiconductor fins may further increase. Also, while the step of partially removing the device isolation layer 17 is performed, the semiconductor fin 15 may be etch-damaged, so that the device reliability may be impacted.

Attempts have been made to apply a CMOS technique using the semiconductor fin to non-volatile memory devices. For example, in U.S. Pat. Nos. 6,768,158 and 6,657,252, non-volatile devices using a semiconductor fin are disclosed. However, in the above references, a silicon-on-insulator (SOI) substrate may be used to form such a semiconductor fin. The SOI substrate may be expensive and may show a floating effect, compared with bulk silicon substrates. Other techniques for manufacturing non-volatile memory devices are described in Korean Publication Number 1999-0075210, published Oct. 15, 1999 to Yoon, entitled *Non-Volatile Memory Cell and Manufacturing Method Thereof.*

SUMMARY OF THE INVENTION

Some embodiments of the present invention provide methods of forming non-volatile semiconductor devices. In these methods, a semiconductor substrate is patterned to form a depression and prominence. As used herein, a prominence means an elongated protuberance, protrusion or fin. A floating gate is formed on an upper surface and both sidewalls of the prominence or only on both sidewalls of the prominence, and an etch process is performed to form a trench for a device isolation self-aligned with the floating gate.

According to the above methods, since the depression and prominence are used as an active region, the width of the active region can be increased. Also, in the etch process for forming the trench, since the floating gate protects the depression and prominence serving as the active region, the depression and prominence can be prevented from being etched. Accordingly, the active region with an increased width and a superior electrical characteristic can be provided.

In addition, since the trench for the device isolation is formed in self-alignment with the floating gate, a part of a bottom (covered by the floating gate) of the depression as well as the upper surface and both sidewalls of the prominence can serve as a channel. Accordingly, the width of the active region can be further increased.

The floating gate may be formed so as to cover the prominence (i.e., formed on the upper surface and both sidewalls of the prominence) or on both sidewalls of the prominence.

The floating gate covering the prominence may be formed by performing a photolithography process after forming the depression and prominence in the semiconductor substrate. In other words, the semiconductor substrate is patterned, a tunneling insulating layer and a conductive layer are formed along the depression and prominence, a photolithography process is performed to form a photoresist pattern on the conductive layer, and the conductive layer on the depression is removed using the photoresist pattern as an etch mask.

Meanwhile, to form a spacer-shaped floating gate on both sidewalls of the prominence, an etch back technique may be used. In this case, to protect the upper surface of the prominence, the mask pattern which was used to form the depression and prominence by patterning the semiconductor substrate may be used. In other words, the mask pattern is formed on the semiconductor substrate and the semiconductor substrate is etched using the mask pattern as an etch mask to form the depression and prominence. A tunneling insulating layer and a conductive layer are formed on both sidewalls of the prominence, and are then etched back to form the spacer-shaped floating gate on the both sidewalls of the prominence.

After the trench self-aligned with the floating gate is formed, a device isolation layer filling the trench may be formed.

A between-gate dielectric and a conductive layer for a control gate are formed, and the conductive layer for the control gate, the between-gate dielectric and the floating gate are patterned. In the case where the floating gate is formed on both sidewalls of the prominence, the mask pattern may be removed prior to forming the between-gate dielectric. At this time, the floating gate is not interposed between the control gate and the upper surface of the prominence. Accordingly, when a high voltage for the programming/erase operation is applied to the control gate, a relatively thick insulating layer may be interposed between the control gate and the upper surface of the prominence so as to reduce or prevent the control gate and the upper surface of the prominence from being short-circuited. For this purpose, the mask pattern for patterning the depression and prominence may be formed by sequentially depositing an oxide layer and a silicon nitride layer which are thicker than the tunneling oxide. In other words, thick oxide and silicon nitride layers are formed on the semiconductor substrate and are patterned to form the mask pattern such that the thick oxide layer is left on the upper surface of the prominence. Since the thick oxide layer can be used as a gate insulating layer of a high voltage transistor in a non-volatile semiconductor device, the gate insulating layer of the high voltage transistor can be formed without a separate additional process. Also, since the floating gate is not interposed between the control gate and the upper surface of the prominence, when a read voltage is applied to the control gate, a channel is directly formed in the upper surface as well as in the both sidewalls of the prominence so that a current amount may increase.

Also, in some embodiments, the device isolation layer is positioned higher than a bottom of the depression. This can reduce or prevent the control gate and the semiconductor substrate at the bottom of the depression from being electrically short-circuited when a high voltage for the programming/erase operation is applied to the control gate.

In other embodiments of the present invention, a method for forming a MOSFET is provided. When the step of forming the between-gate insulating layer is omitted from the method of forming the non-volatile semiconductor device, a MOSFET can be formed. In other words, the floating gate in the method of forming the non-volatile semiconductor device can be formed directly in contact with the control gate, so that the floating gate and the control gate serve as a gate electrode of the MOSFET.

In these embodiments, a method of forming a MOSFET includes patterning a semiconductor substrate to form a depression and prominence serving as an active region, forming a lower conductive pattern for a gate electrode so as to cover the prominence of the depression and prominence or on both sidewalls of the prominence, performing an etch to form a trench self-aligned with the lower conductive pattern, forming a device isolation layer filling the trench, depositing an upper conductive layer for a gate electrode, and patterning the upper conductive layer and the lower conductive pattern.

According to the above methods of forming the MOSFET, the lower conductive pattern can protect the depression and prominence serving as the active region during the etch step of forming the trench.

Also, since the trench for the device isolation is formed in self-alignment with the lower conductive pattern, a part of the depression as well as the prominence serves as a channel, so that a current driving capability of the MOSFET may be enhanced.

In still another embodiments of the present invention, a semiconductor device is provided. The semiconductor device includes: a second prominence that protrudes from a semiconductor substrate and a first prominence protruded from an upper surface of the second prominence, the first prominence having a lower width that is narrower than a width of an upper surface of the second prominence. A first insulating layer is provided on the upper surface of the first prominence. A second insulating layer is provided on both sidewalls of the first prominence and on the upper surface of the first prominence exposed at both sides of the first prominence. A first conductive layer is interposed between the first and second insulating layers between the first conductive layer and the upper surface of the first prominence and between the first conductive layer and the both sidewalls of the first prominence and also is interposed between the second insulating layer between the first conductive layer and the upper surface of the second prominence exposed at both sides of the first prominence. A device isolation layer covers both sidewalls of the second prominence and a part of both sidewalls of the first conductive layer.

According to some embodiments of the above semiconductor device, the upper surface of the second prominence outside the first prominence as well as the first prominence serves as an active region.

In some embodiments of the above semiconductor device, if the first insulating layer and the second insulating layer are a thermal oxide, the semiconductor device can correspond to a MOSFET. In some embodiments, the first conductive layer serves as a gate electrode. On the other hand, if each of the first insulating layer and the second insulating layer is formed in a multi-layer (ONO) structure including an oxide layer, a nitride layer, and an oxide layer sequentially stacked, the semiconductor device can correspond to a floating trap type non-volatile semiconductor device, such as a SONOS device. In these embodiments, when the first conductive layer serves as a gate electrode and a high voltage is applied to the first conductive layer, charges are injected from the both sidewalls and the upper surface of the first prominence and the upper surface of the second prominence into the nitride layer through the oxide layer.

Also, if the semiconductor device further includes a third insulating layer on the first conductive layer and the device isolation layer, and a second conductive layer on the third insulating layer, the semiconductor device corresponds to a floating gate type non-volatile semiconductor device, such as a flash device. The first conductive layer serves as a floating gate and the second conductive layer serves as a control gate. In these embodiments, tunneling of charges occurs through the first insulating layer on the upper surface of the first prominence and the second insulating layer on the both sidewalls of the first prominence and the upper surface of the second prominence outside the first prominence.

In embodiments of the floating gate type non-volatile semiconductor device, the first conductive layer is not formed on the upper surface of the first prominence but can be formed in the form of a spacer on the both sidewalls of the first prominence. In this case, the first insulating layer is thicker than the second insulating layer, and accordingly, the tunneling of charges occurs through the second insulating layer.

Since the first prominence serves as a channel region, in some embodiments, the first prominence is constant in width to allow enhanced device reliability. To potentially enhance the filling property of the device isolation layer, the second prominence may have a width increasing as it extends to a lower side.

In some embodiments, the upper surface of the device isolation layer be positioned higher than the upper surface of the second prominence. Accordingly, when a high voltage for the programming/erase operation is applied to the second conductive layer, an electrical short-circuit between the second conductive layer and the upper surface of the second prominence can be effectively reduced or prevented.

DETAILED DESCRIPTION OF THE INVENTION

Figure 1A:
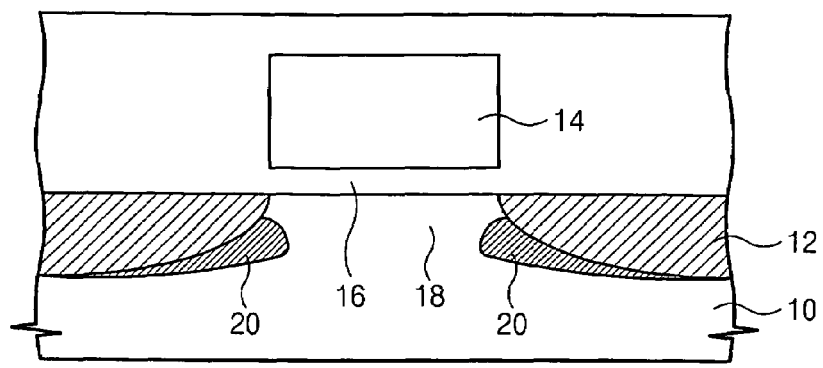
FIG. 1A is a cross-sectional view of a conventional planar FET.
Figure 1B:
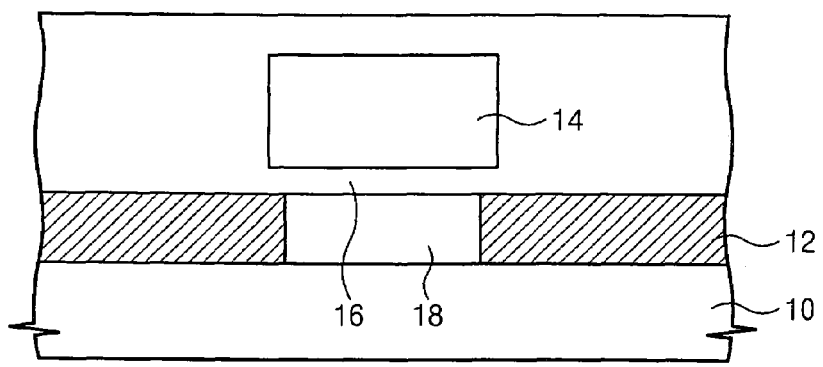
FIG. 1B is a cross-sectional view of a conventional ultra-thin body transistor.
Figure 1C:
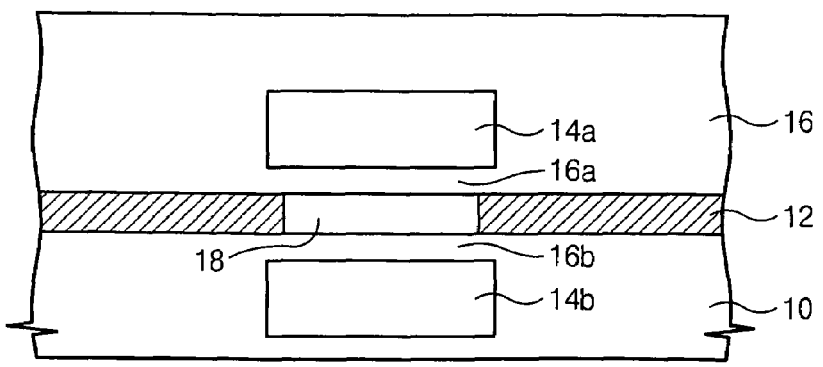
FIG. 1C is a cross-sectional view of a conventional dual-gate FET.
Figure 2A:
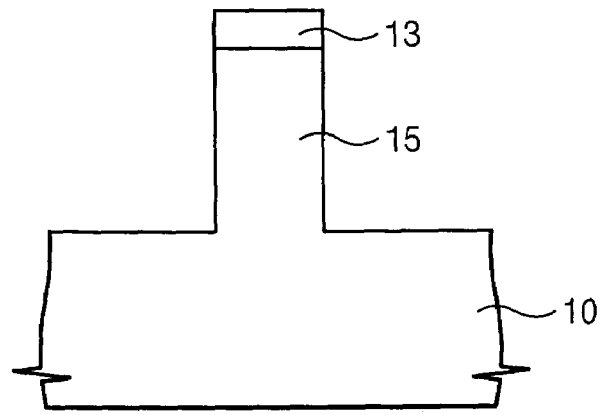
FIGS. 2A to 2D are cross-sectional views illustrating a method for forming a conventional fin FET.
Figure 2B:
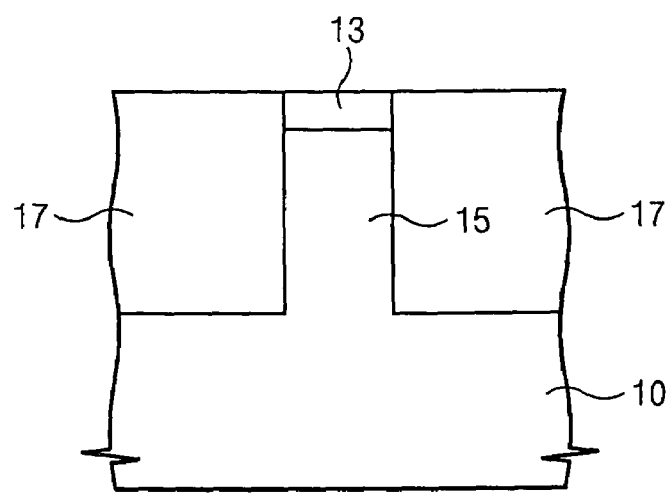
Figure 2C:
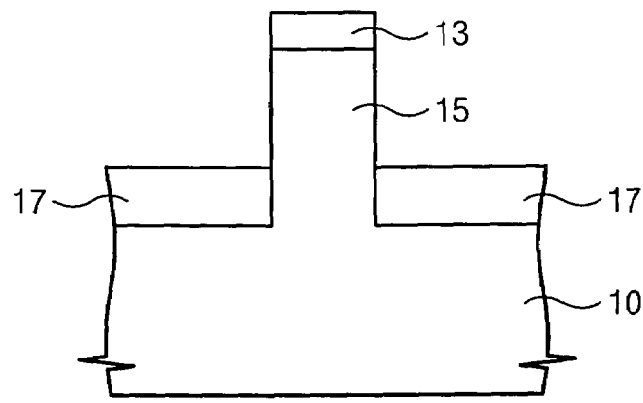
Figure 2D:
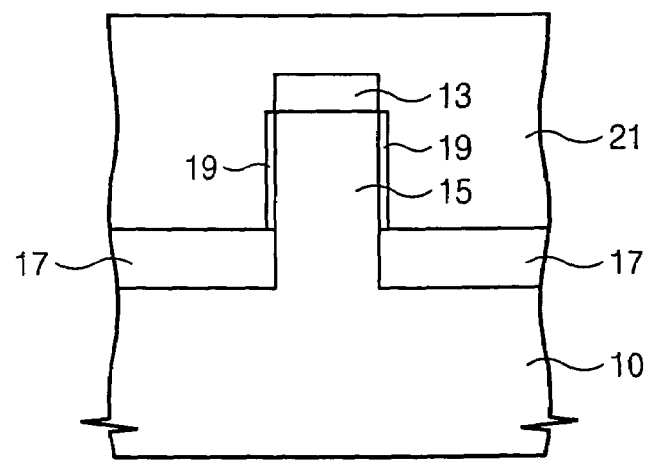

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper", "higher" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. As another example, sharp corners will, typically, be rounded to some extent, and straight lines will, typically, have some surface roughness. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
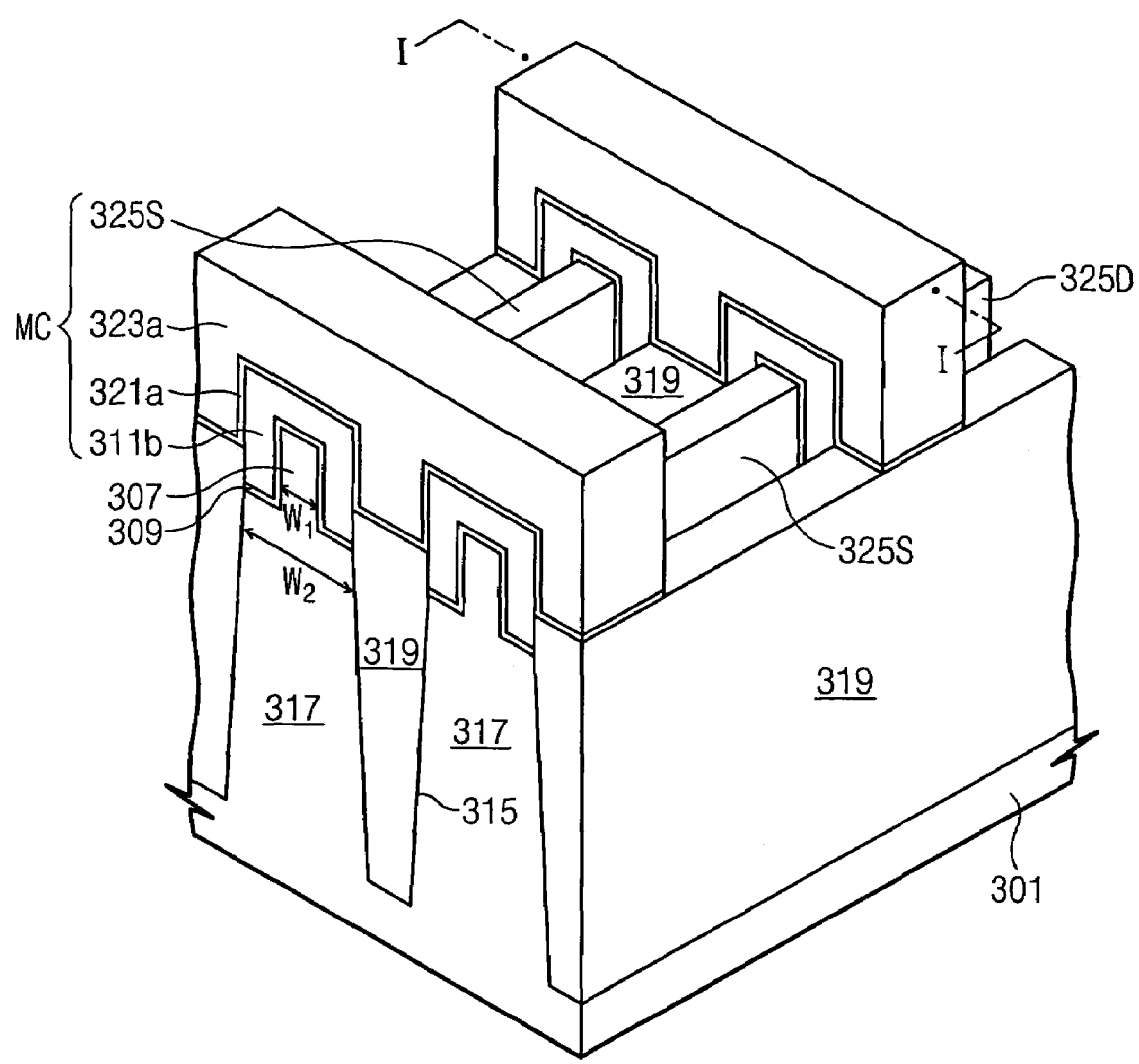
FIG. 3 is a perspective view of a non-volatile semiconductor device having a non-volatile memory cell according to some embodiments of the present invention.

FIG. 3 is a perspective view of a non-volatile semiconductor device having a non-volatile memory cell according to some embodiments of the present invention. In FIG. 3, for the simplification of the drawing and better understanding of the present invention, only four memory cells are shown. Referring to FIG. 3, a plurality of memory cells (MC) are arranged in two dimensions on a semiconductor substrate 301. Each memory cell (MC) has a stack gate structure in which a floating gate 311b, a second insulating layer (or between-gate insulating layer) 321a, and a control gate 323a are sequentially stacked interposing a first insulating layer (or tunneling insulating layer) 309 between the substrate 301 and the floating gate 311b, and further includes source 325S and drain 325D disposed at both sides thereof. The semiconductor substrate 301 has a depression and prominence structure. As used herein, a prominence means an elongated protuberance, protrusion or fin. The depression and prominence run in a direction (i.e., a bit line direction) perpendicular to a word line. More specifically, the prominence includes a first prominence 307 and a second prominence 317 integrated with the first prominence 307. The first prominence 307 has a width (w1) that is narrower than a width (w2) of the second prominence 317, i.e., w1<w2. Accordingly, an upper surface of the second prominence 317 positioned at both sides of the first prominence 307 is exposed. In some embodiments, the width (w1) of the first prominence 307 is constant, and the width (w2) of the second prominence 317 is widened as it extends to a lower side. By the double prominence structure, both sidewalls and an upper surface of the first prominence, and the upper surface of the second prominence 317, serve as a width of an active layer. Accordingly, the non-volatile memory cell (MC) can have enhanced programming/erase operations and a high current driving capability in a read operation.

Since the width (w1) of the first prominence 307 is constant, it is possible to secure a reliable device operation characteristic. Since the width (w2) of the second prominence 317 can increase as it extends to a lower side, the filling property of the device isolation layer 319 for a device isolation can be enhanced.

The floating gate 311b is formed on the upper surface and sidewalls of the first prominence 307 and the upper surface of the second prominence 317, interposing the tunneling insulating layer (first insulating layer) 309 between the floating gate 311b and the first and second prominences 307 and 317. The device isolation layer 319 is positioned in self-alignment with the floating gate 311b. The between-gate insulating layer (second insulating layer) 321a is formed on the floating gate 311b and on the device isolation layer 319, and the control gate 323a is formed on the between-gate insulating layer (second insulating layer) 321a. The control gate 323a serves as a word line. The control gate 323a runs across the depression and prominence, and the floating gate 311b is formed on the depression and prominence overlapping the control gate 323a.

In some embodiments, the device isolation layer 319 fills a trench 315 between the second prominences to electrically isolate the first prominence 307 and the second prominence 317 from adjacent to the first and second prominences. In some embodiments, the device isolation layer 319 partially fills a space (or depression) between the first prominences 307. In other words, the device isolation layer 319 has an upper surface that is higher than an upper surface of the second prominence 317. To this end, an electrical short-circuit between the second prominence 317 and the control gate 323a to which a high voltage is applied for the programming/erase operation of the non-volatile memory can be reduced or prevented.

The tunneling insulating layer 309 is, for example, formed of silicon oxide, and has a thickness designed such that the tunneling of charges can occur through the tunneling insulating layer 309. The between-gate insulating layer 321a is, for example, formed in a multiplayer structure of oxide-nitride-oxide (ONO). The between-gate insulating layer 321a reduces or prevents the charges stored in the floating gate 311b from being leaked to the control gate 323a.

Operations of the unit memory cell (MC) of the non-volatile memory device shown in FIG. 3 will now be described in brief. First, an erase operation of the unit memory cell (MC) will be described. When a ground voltage (0V) is applied to the control gate 323a, the source (S) and drain (D) are floated, and a voltage of about 20 V is applied to the substrate 301, charges escape from the floating gate 311b to the upper surface and sidewalls of the first prominence 307 and the upper surface of the second prominence 317 through the tunneling insulating layer 309. As a result, a threshold voltage of the memory cell becomes about −1 to about −3 volts ('On' state).

Next, programming operations of the unit memory cell will be described. When a voltage of about 15 V to about 20 V is applied to the control gate 323a, a ground voltage is applied to the source 325S, the drain 325D and the semiconductor substrate 301, charges are injected into the floating gate 311b from the upper surface and sidewalls of the first prominence 307 and the upper surface of the second prominence 317 through the tunneling insulating layer 309. As a result, a threshold voltage of the memory cell becomes about 1 to about 3 volts ('Off' state).

The threshold voltage of the memory cell (MC) becomes readable in two states according to a proper bias condition, which represents a binary state constituting a base of the memory. Accordingly, when a predetermined bias voltage is applied to the control gate such that the memory cell receives a value between the two threshold voltages, for example, an intermediate value between the two threshold voltages, whether or not a channel is formed below the memory cell is determined according to the states (On state or Off state) of the memory cell, so that the two states are readable.

For instance, when the semiconductor substrate 301, the control gate 323a and the source 325S are grounded and a voltage of about 1.2 volts is applied to the drain 325D, the memory cell in On state is turned on. In other words, a channel is formed in an active region between the source 325S and the drain 325D, i.e., in the upper surface and both sidewalls of the first prominence 307 and the upper surface of the second prominence 317. Since the channel is formed even in the upper surface of the second prominence 317, a current amount can increase in a read operation. In contrast, under a bias condition on the read operation as above, the memory cell in Off state does not form a channel.

The bias conditions on the aforementioned programming/erase operation and the read operation are only exemplary.

Figure 4:
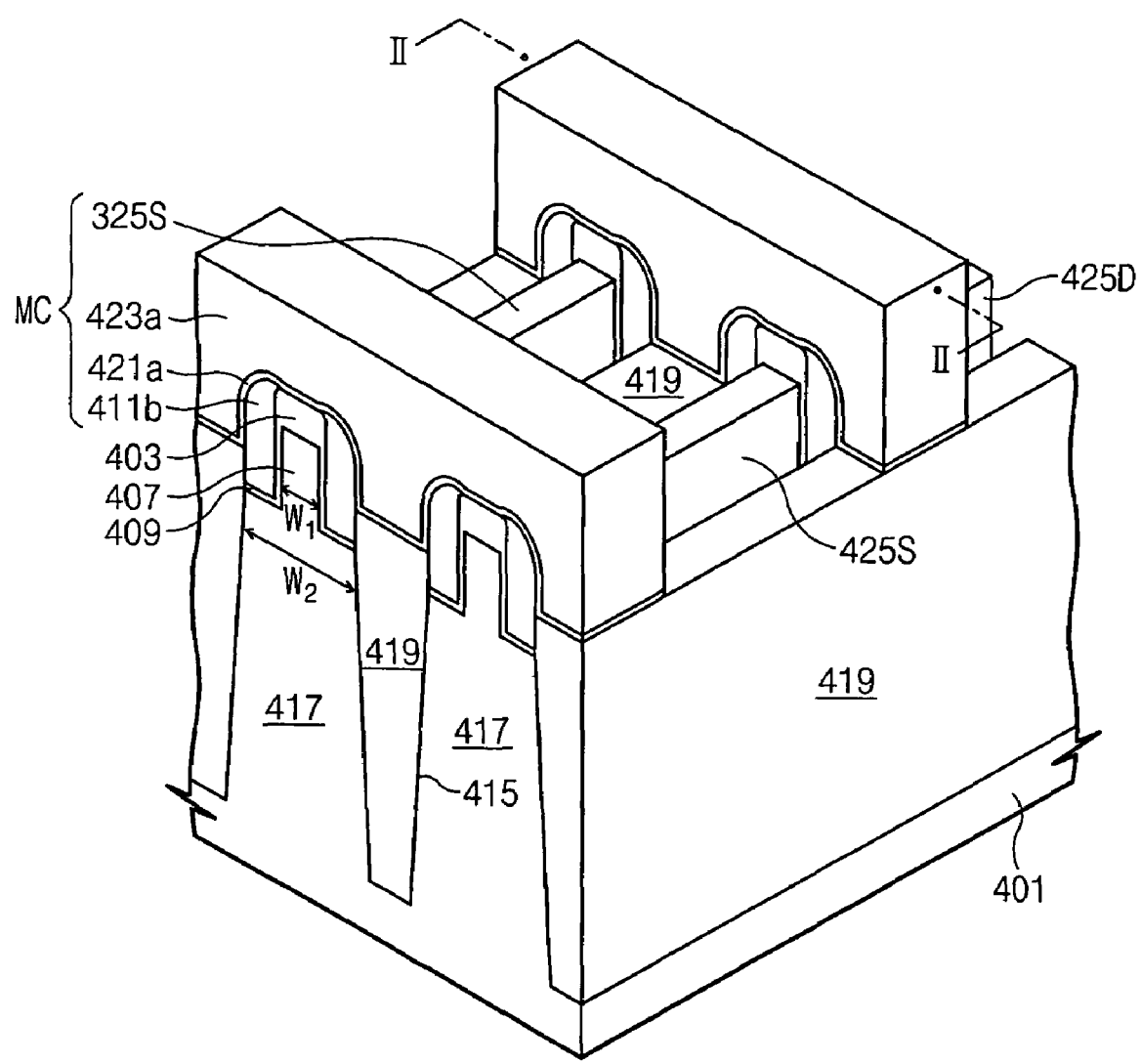
FIG. 4 is a perspective view of a non-volatile semiconductor device having a non-volatile memory cell according to other embodiments of the present invention.

FIG. 4 is a perspective view of a non-volatile semiconductor device having a non-volatile memory cell according to other embodiments of the present invention. Like the semiconductor device described with reference to FIG. 3, a semiconductor substrate 401 has a depression and prominence structure. Unlike in the semiconductor device of FIG. 3, a first insulating layer (high voltage gate insulating layer) 403 formed on a first prominence 407 is different in thickness from a second insulating layer (tunneling insulating layer) 409 formed on both sidewalls of the first prominence 407, and the first prominence 407 does not have a floating gate on the upper surface thereof. In other words, on an upper surface of the first prominence 407, the high voltage gate insulating layer 403, a third insulating layer (between-gate insulating layer) 421a and a control gate 423 are stacked. Also, a floating gate 411b is formed on both sidewalls of the first prominence 407 and on the upper surface of the second prominence, interposing the tunneling insulating layer 409.

The high voltage gate insulating layer 403 (first insulating layer) is formed thick such that it can endure a high voltage applied to the control gate 423a for the programming/erase operation of the non-volatile memory cell, whereas the tunneling insulating layer (second insulating layer) 409 is formed thin such that the tunneling of charges occurs in the programming/erase operation. In other words, when a high voltage is applied to the control gate 423a, the high voltage gate insulating layer (first insulating layer) 403 is formed at a thickness that can reduce or prevent the control gate 423a and the upper surface of the first prominence 407 from being electrically short-circuited.

Accordingly, according to the aforementioned non-volatile semiconductor device, charge movement occurs from the both sidewalls of the first prominence 407 and the upper surface of the second prominence 417 to the floating gate 411b, or vice verse in the programming/erase operation of the non-volatile memory cell. Meanwhile, in the read operation of the non-volatile memory cell, the upper surface of the first prominence 403 as well as the both sidewalls of the first prominence 407 and the upper surface of the second prominence 417 serves as a channel region, so that a current driving capability can be enhanced.

Non-volatile semiconductor devices described referring to FIGS. 3 and 4 may include a nitride layer formed on the upper surface of the first prominence 307 or 407. For example, in the non-volatile memory cell of FIG. 3, a nitride layer can be further interposed between the floating gate 311b and the tunneling insulating layer 309 on the upper surface of the first prominence 307, and in the non-volatile memory cell of FIG. 4, a nitride layer can be further interposed between the between-gate insulating layer 421a and the high voltage gate insulating layer 403. In these cases, during the read operation for the non-volatile memory cell, the upper surface of the first prominence may not serve as a channel. Also, during the programming/erase operation for the non-volatile memory cell, the tunneling may not occur in the upper surface of the first prominence.

The above description of embodiments of the present invention may also be applied to a MOSFET. If the non-volatile memory devices of FIGS. 3 and 4 are not provided with the between-gate insulating layer 321, 421, they can correspond to the MOSFET. Accordingly, in this case, the MOSFET has a channel region defined in the upper surface and both sidewalls of the first prominence and the upper surface of the second prominence, so that the current driving capability can increase. Also, a portion where the first prominence and the second prominence meet with each other is shaped in a step, so that margins in the photolithography process for the source/drain contact and in the misalignment for an etch process can increase.

In addition, if the control gate and the floating gate are electrically connected with each other, the non-volatile memory devices of FIGS. 3 and 4 become a MOSFET, which may be applied, for example, to a MOSFET constituting a string selection line and a ground selection line connected to a memory cell in a NAND type flash memory device. In other embodiments, a single gate layer may be used.

Further, if the non-volatile memory devices of FIGS. 3 and 4 are not provided with the between-gate insulating layer 321, 421 and the tunneling insulating layer 311b, 411b is replaced by a multi-layer structure including oxide-nitride-oxide, they can provide a SONOS device that is a floating trap type non-volatile memory device.

Figure 5A:
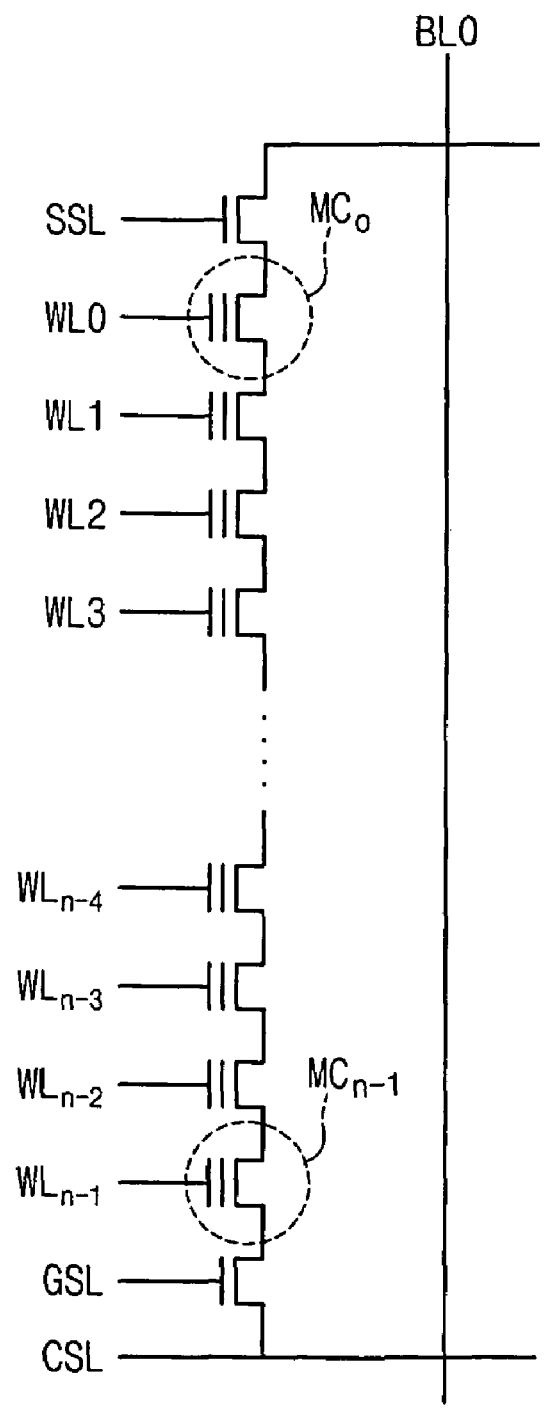
FIG. 5A is an equivalent circuit diagram of a NAND type flash memory device having a non-volatile memory cell of FIG. 3.
Figure 5B:
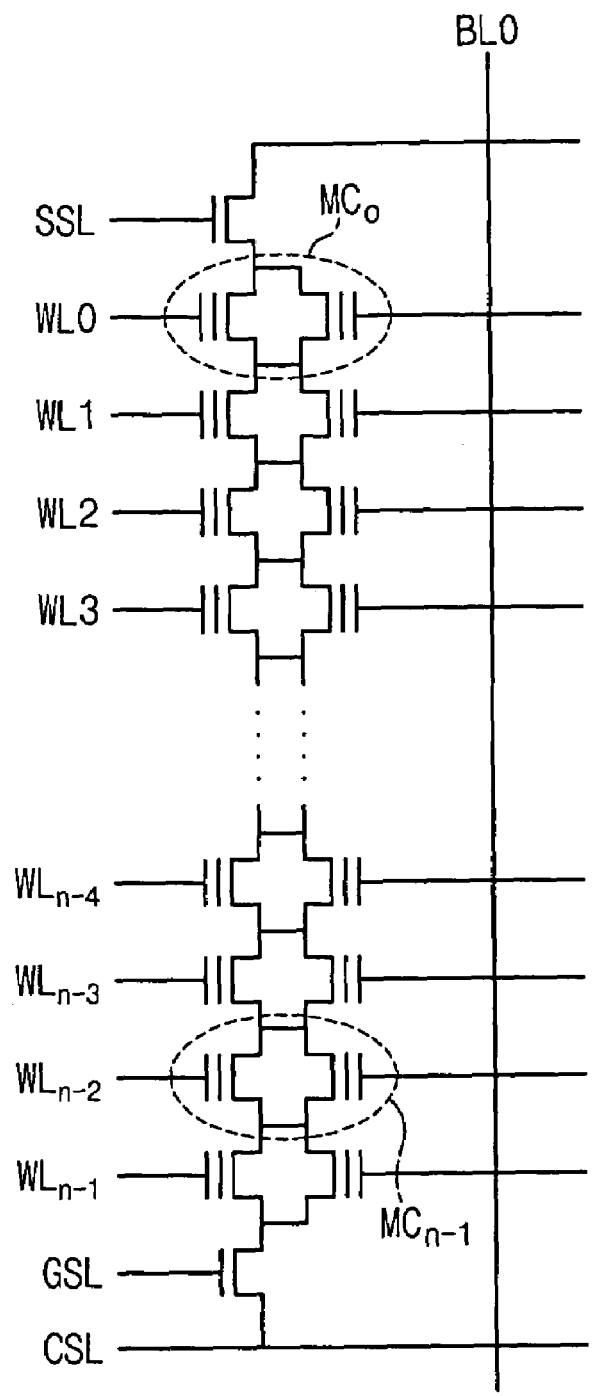
FIG. 5B is an equivalent circuit diagram of a NAND type flash memory device having a non-volatile memory cell of FIG. 4.

FIGS. 5A and 5B are equivalent circuit diagrams of NAND type flash memory devices having the non-volatile memory cells of FIGS. 3 and 4.

First, referring to FIG. 5A, n-number (e.g., 32) of memory cells MC0-MCn−1 are connected in series to one bit line BL0, which is generally called one 'string'. These strings are repeatedly arranged in an X-axis direction and are mirror-image arranged in a Y-axis direction. Word lines WL0-WLn−1 perpendicularly intersect the bit line BL0 and memory cells MC0-MCn−1 are connected to these word lines WL0-WLn−1. In other words, the control gates 323 of the adjacent memory cells are connected with each other to form the word line. Between the bit line BL0 and the word line WL0, a string selection line SSL is interposed. A ground selection line GSL and a common source line CSL are connected to the word line WLn−1.

The string selection line SSL and the ground selection line GSL in the non-volatile memory cell structure of FIG. 3 are designed such that the floating gate 311a and the control gate 323 are connected with each other through a butting contact.

Referring to FIG. 5B, since in the non-volatile memory device of FIG. 4, the floating gate 411b is formed on the both sidewalls of the first prominence 407, one unit memory cell (MC) is comprised of two vertical transistors connected in parallel.

Since the circuit operations of FIGS. 5A and 5B are well known to those skilled in the art, their detailed description need not be provided.

Hereinafter, methods of forming non-volatile memory devices described with reference to FIGS. 3 and 4 will be described in detail.

FIGS. 6A to 6G are cross-sectional views of semiconductor substrates taken along the word line direction (line I-I of FIG. 3) for illustrating methods of forming non-volatile semiconductor devices of FIG. 3 according to some embodiments of the present invention.

Figure 6A:
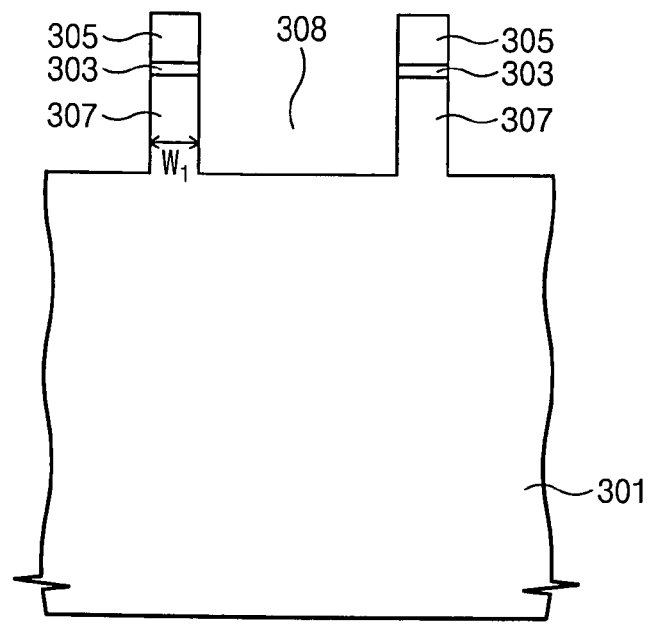
FIGS. 6A to 6G are cross-sectional views of semiconductor substrates for illustrating methods of forming a non-volatile semiconductor device of FIG. 3 according to some embodiments of the present invention.

First, referring to FIG. 6A, a mask pattern 305 is formed on a semiconductor substrate 301 and the semiconductor substrate 301 is then etched using the mask pattern 305 as an etch mask such that the semiconductor substrate 301 has a depression and prominence structure having a depression 308 and a first prominence 307. The depression and prominence structure runs in a direction (i.e., bit line direction) perpendicular to the word line. The semiconductor substrate 301 can be, for example, selected from a wafer cut away from a Czochralski or float zone prepared using a single crystalline silicon, or a substrate including at least one an epitaxial layer, a buried oxide layer or a doped region. Accordingly, bulk or semiconductor-on-insulator substrates may be used.

The mask pattern 305 can be formed by a photolithography process as is well known. For example, the mask pattern 305 can be formed by a method including forming a silicon nitride layer on a semiconductor substrate having a thermal oxide layer 303 formed thereon, coating a photosensitive film such as a photoresist film on the silicon nitride layer, exposing and developing the resultant semiconductor substrate to form a photoresist pattern, and etching the silicon nitride layer using the photoresist pattern as an etch mask. In some embodiments, a pad oxide 303 as a buffer layer may be further formed between the mask pattern 305 and the substrate 301. The pad oxide 303 can be formed by thermally oxidizing the semiconductor substrate 301. The exposed pad oxide 303 and the semiconductor substrate are etched to a predetermined depth using the mask pattern 305 as an etch mask to form the depression and prominence structure.

The width (w1) of the first prominence 307 depends on the width of the mask pattern 305 and may be influenced by the photolithography process, and, in some embodiments, is formed at a minimum value allowable by the photolithography process. Also, the etch process for the semiconductor substrate 301 is performed such that the width (w1) of the first prominence 307 is constant in some embodiments. The reliability of the device may be increased, in some embodiments, if the width (w1) of the first prominence 307 is constant, i.e., the sidewalls of the first prominence 307 have a vertical profile.

Figure 6B:
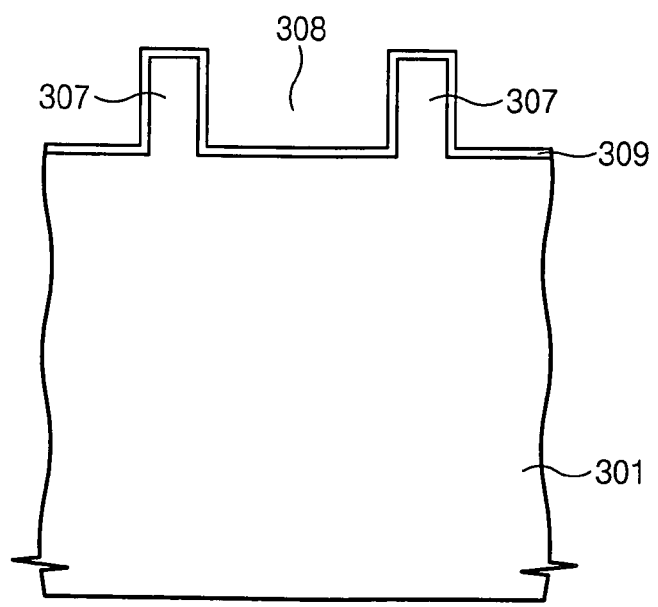

Referring to FIG. 6B, after the mask pattern 305 and the pad oxide 303 are removed, a first insulating layer 309 is formed on the semiconductor substrate 301 having the depression and prominence structure. In some embodiments, the first insulating layer is formed at a uniform thickness along the depression and prominence of the semiconductor substrate 301. Also, the first insulating layer 309 is formed at a thickness that can cause a tunneling phenomenon during the programming/erase operation in the non-volatile semiconductor device. The first insulating layer 309 may be, for example, formed by performing a thermal oxidation process of the semiconductor substrate having the depression and prominence structure. The thermal oxidation process can also function to cure an etch damage caused by the etch process for forming the depression and prominence previously. In some embodiments, the pad oxide 303 may not be removed. In this case, the first insulating layer 309 would be formed on both sidewalls of the first prominence, and the pad oxide 303 and the first insulating layer 309 would serve as a tunneling insulating layer.

Figure 6C:
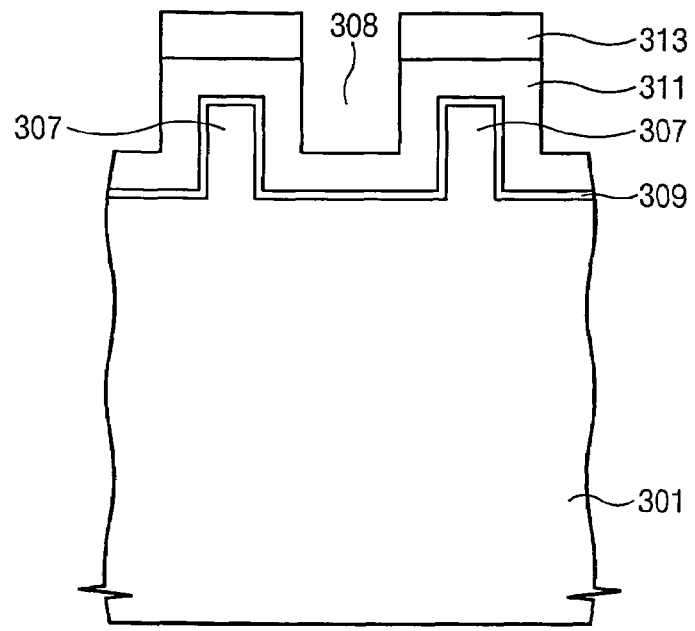

Referring to FIG. 6C, a first conductive layer 311 for a floating gate is formed on the first insulating layer 309. For example, the first conductive layer 311 may comprise doped polysilicon. For electrical isolation of the first conductive layer 311 in the word line direction, a photoresist pattern 313 which will be used as an etch mask, is formed on the first conductive layer 311. In other words, a photolithography process is performed to form a photoresist pattern 313 formed on the first conductive layer 311 on the first prominence and exposing the first conductive layer 311 on the depression 308. When the depression and prominence are at the same time formed on a scribe line as well as on the semiconductor substrate, the depression and prominence formed on the scribe line can be used as an alignment key for the photolithography process.

Figure 6D:
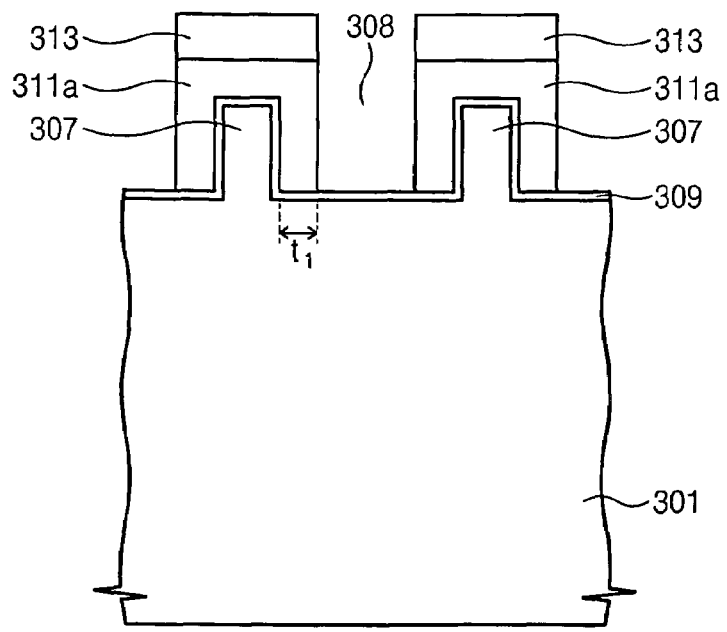

Referring to FIG. 6D, the exposed first conductive layer 311 is etched using the photoresist pattern 313 as an etch mask to form a floating gate pattern 311a separated in the word line direction. In other words, the floating gate pattern 311a covers the upper surface and both sidewalls of the first prominence running in the bit line direction and a part of bottoms of the depressions of both sides of the first prominence 307. Ultimately, the floating gate pattern 311a runs in the bit line direction (perpendicular to the word line direction). The dimension of the bottoms of the depressions 308 covered with the floating gate pattern 311a depends on the thickness (t1) of the first conductive layer 311.

Figure 6E:
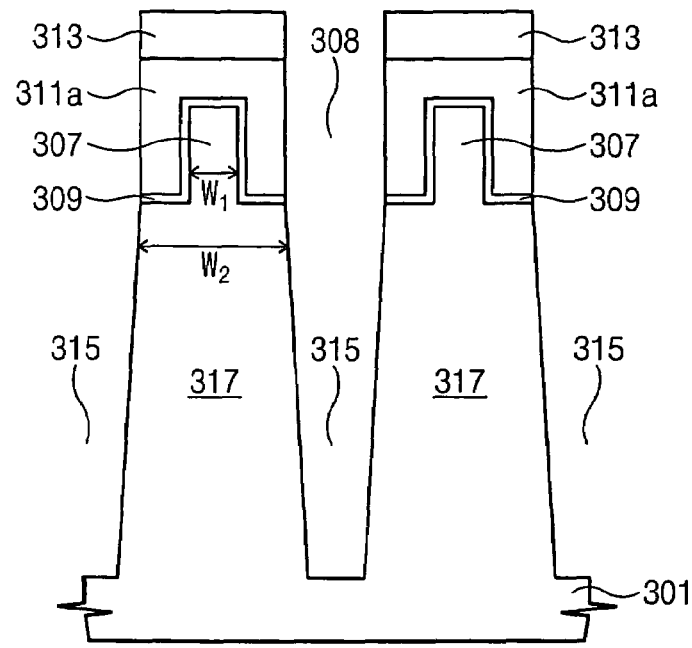

Referring to FIG. 6E, the first insulating layer and the substrate exposed outside the floating gate pattern 311a are etched to a predetermined depth using the photoresist pattern 313 as an etch mask to form a trench 315 for a device isolation. As a result, a second prominence 317 of which an upper width (w2) is greater than the width (w1) of the first prominence 307 is integrated with the first prominence 307. In some embodiments, the second prominence 317 is formed such that its width (w2) gradually increases as it extends to a lower side. In other words, in some embodiments, the sidewalls of the second prominence 317 are oblique. Accordingly, a filling property of a device isolation layer to be formed in a subsequent process may be enhanced.

The upper surface and both sidewalls of the first prominence 307 and the upper surface of the second prominence 317 exposed at both sides of the first prominence, which will be used as an active layer, are covered with the floating gate pattern 311a so that they are protected during the etch process to form the trench 315.

After the trench 315 is formed, a thermal treatment to cure an etch damage may be performed in an oxygen-containing atmosphere. At this time, a surface of the floating gate pattern 311a is partially oxidized to form an oxide layer, which will be at the same time removed together with the device isolation layer during an etch back process of the device isolation layer, as will be described below.

Figure 6F:
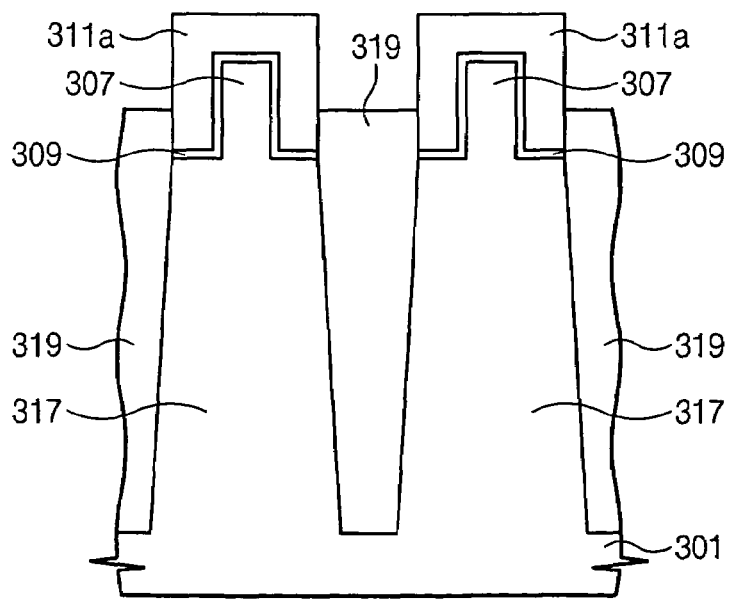

Referring to FIG. 6F, after the photoresist pattern 313 is removed, in some embodiments, the trench 315 is filled with an insulator to form a device isolation layer 319. In some embodiments, the device isolation layer is formed such that an upper surface of the device isolation layer 319 is positioned higher than the upper surface of the second prominence 317, i.e., the device isolation layer 319 covers a lower side of the floating gate pattern 311a. The device isolation layer 319 can be formed by depositing an insulating layer and performing an etch back process of the deposited insulating layer, or sequentially performing a planarization process and an etch back process. In the case where the planarization process and the etch back process are sequentially performed, the planarization process may be performed until the floating gate pattern 311a is exposed. At this time, to cure the etch damage due to the etch process for the formation of the trench, the oxide layer formed on the surface of the floating gate pattern by the thermal oxidation is at the same time removed together with the device isolation layer.

Figure 6G:
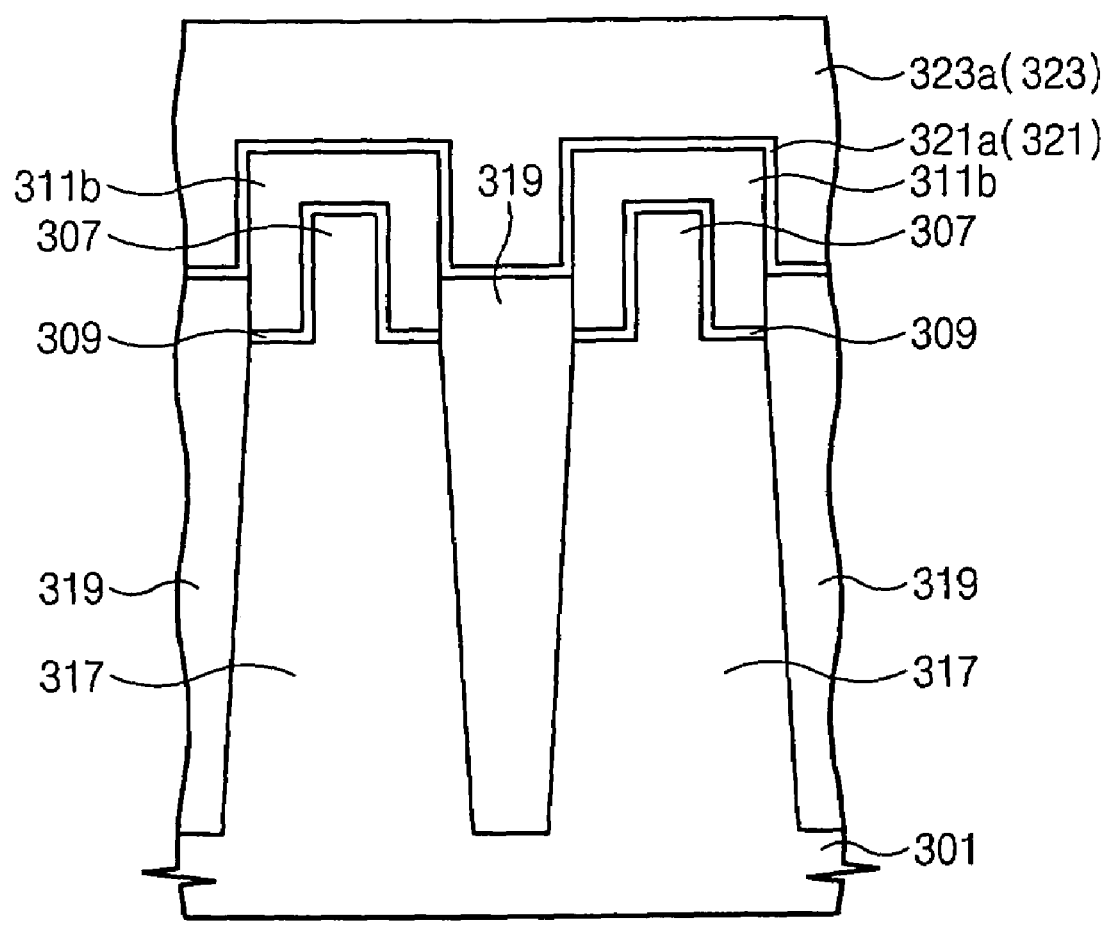

Referring to FIG. 6G, a second insulating layer 321 and a second conductive layer 323 for a control gate are deposited. Thereafter, for an electrical isolation of the floating gate pattern in the bit line direction (perpendicular to the word line direction) and to form a control gate isolated in the bit line direction, a photolithography process and an etch process are performed. The etch process is performed with respect to the second conductive layer 323, the second insulating layer 321 and the floating gate pattern 311a. As a result, a control gate 323a is formed from the second conductive layer 323, a between-gate insulating layer 321a is formed from the second insulating layer 321, and a floating gate 311b is formed from the floating gate pattern 311a.

Thereafter, a conventional process for forming a general NAND flash memory device, for example, a conventional process for forming a source/drain, a butting contact process, a process for forming an interlayer insulating layer, a process for forming a bit line, and the like, may be performed.

The second insulating layer for the between-gate insulating layer 321a is, for example, formed in a multi-layer structure of oxide-nitride-oxide. The second conductive layer for the control gate 323a is, for example, formed of a doped polysilicon, a polysilicide, or a combination of them.

In methods of forming non-volatile memory devices according to the embodiments of the present invention described above, the upper surface and both sidewalls of the first prominence and the upper surface of the second prominence serve as a channel region. Accordingly, the efficiency of the programming/erase operation can be enhanced and a current amount can increase during the read operation.

Also, the trench 315 for the device isolation is formed on the first prominence 307 after the floating gate pattern 311a is formed, and the device isolation layer 319 is formed in self-alignment with the floating gate pattern 311a. Accordingly, the first prominence 307 can be protected during the etch process for forming the trench 315.

Methods of forming the non-volatile memory device according to the above embodiments can be applied to methods for forming a MOSFET or a SONOS non-volatile memory device. In other words, in the aforementioned methods, if the second insulating layer used as the between-gate insulating layer is not formed, a MOSFET may be formed. Also, if the first insulating layer used as a tunneling insulating layer is formed of an oxide-nitride-oxide and the second insulating layer used as the between-gate insulating layer is not formed, a SONOS non-volatile memory device may be formed.

Further, in the aforementioned methods, when the non-volatile memory device is formed in a cell array region, a MOSFET can be formed in a peripheral circuit region. In this case, it is noted that the second insulating layer that is the between-gate insulating layer can be removed by a photolithography process and an etch process in the peripheral circuit region.

Methods of forming the non-volatile memory devices shown in FIG. 4 according to some embodiments of the present invention will now be described with reference to FIGS. 7A to 7G. FIGS. 7A to 7G are cross-sectional views of a semiconductor substrate for describing methods of forming a non-volatile semiconductor device shown in FIG. 4, and are sectional views taken along the word line direction (line II-II of FIG. 4).

Figure 7A:
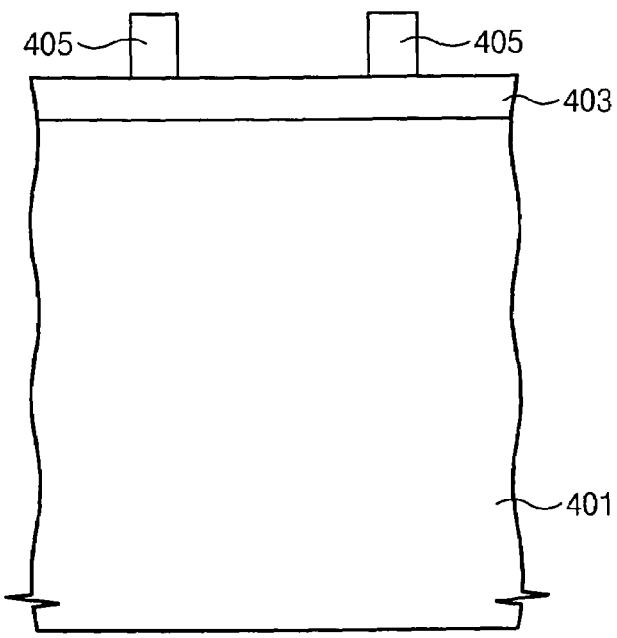
FIGS. 7A to 7G are cross-sectional views of semiconductor substrates for illustrating methods of forming a non-volatile semiconductor device of FIG. 4 according to other embodiments of the present invention.

Referring to FIG. 7A, a first insulating layer 403 is formed on a semiconductor substrate 401. The first insulating layer 403 can be formed, for example, by a thermal oxidation process of the semiconductor substrate 401. As will be described below, since a floating gate does not exist between the control gate and the upper surface of the first prominence, the first insulating layer 403 may be formed at a thickness that does not permit occurrence of a tunneling phenomenon.

A mask pattern 405 is formed on the first insulating layer 403. The mask pattern 405 can be formed by depositing a silicon nitride layer using a well known thin film deposition method, such as a chemical vapor deposition (CVD), and performing a photolithography process and an etch process.

Figure 7B:
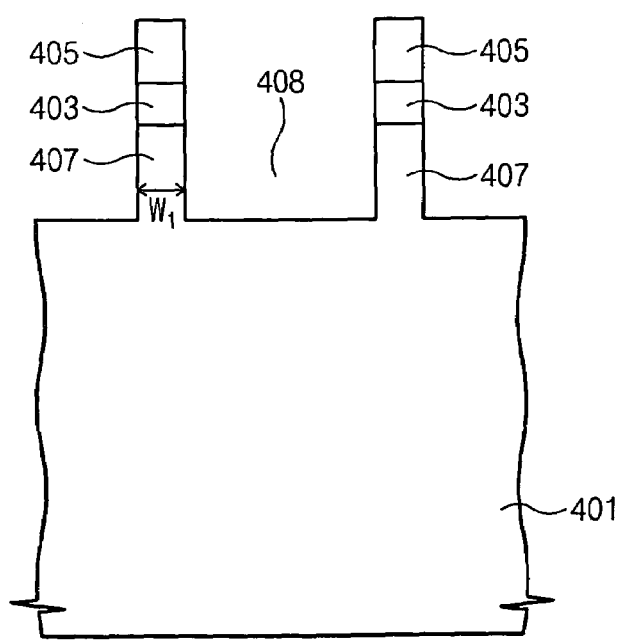

Referring to FIG. 7B, the exposed first insulating layer 403 and the semiconductor substrate are etched to a predetermined depth using the mask pattern 405 as an etch mask to form a semiconductor substrate having the depression and prominence structure including a first prominence 407 and a depression 408. The depression and prominence structure runs in the bit line direction (perpendicular to the word line direction). The width (w1) of the first prominence 407 may depend on the width of the mask pattern 405 influenced by the photolithography process, and may be formed as narrow as possible in some embodiments.

Figure 7C:
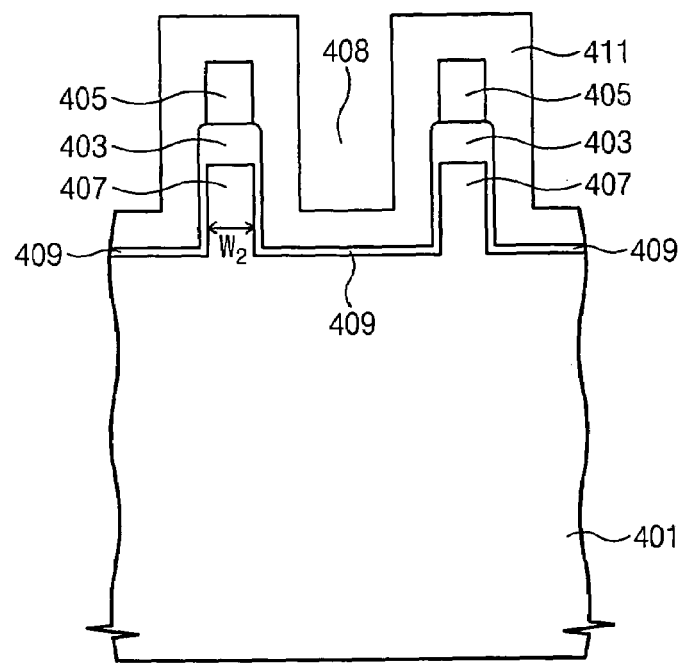

Referring to FIG. 7C, a second insulating layer 409 serving as a tunneling insulating layer is formed on both sidewalls of the first prominence. The second insulating layer 409 is formed of, for example, a thermal oxide, and is formed thinner than the first insulating layer 403. Thereafter, a first conductive layer 411 for a floating gate is formed along a profile of the underlying structure. The first conductive layer 411 may be formed of doped polysilicon by a well known method.

Figure 7D:
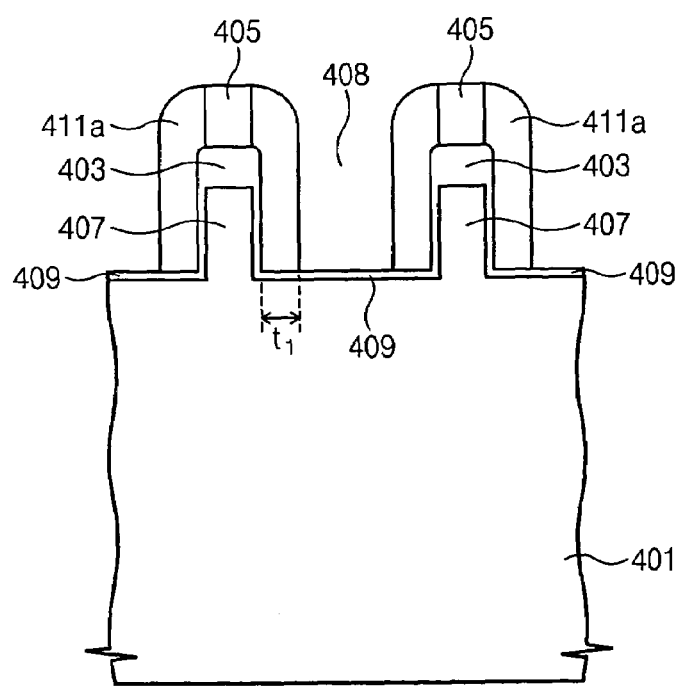

Referring to FIG. 7D, an etch back process is performed to form a floating gate pattern 411a electrically separated in the word line direction. By performing the etch-back process, the first conductive layer is left on the both sidewalls of the first prominence 407 and on both sidewalls of the mask pattern 405 to form a floating gate pattern 411a. The floating gate pattern 411a runs in the bit line direction. The bottom of the depression 408 is covered with the floating gate pattern 411a by a thickness (t1) of the first conductive layer 411.

Figure 7E:
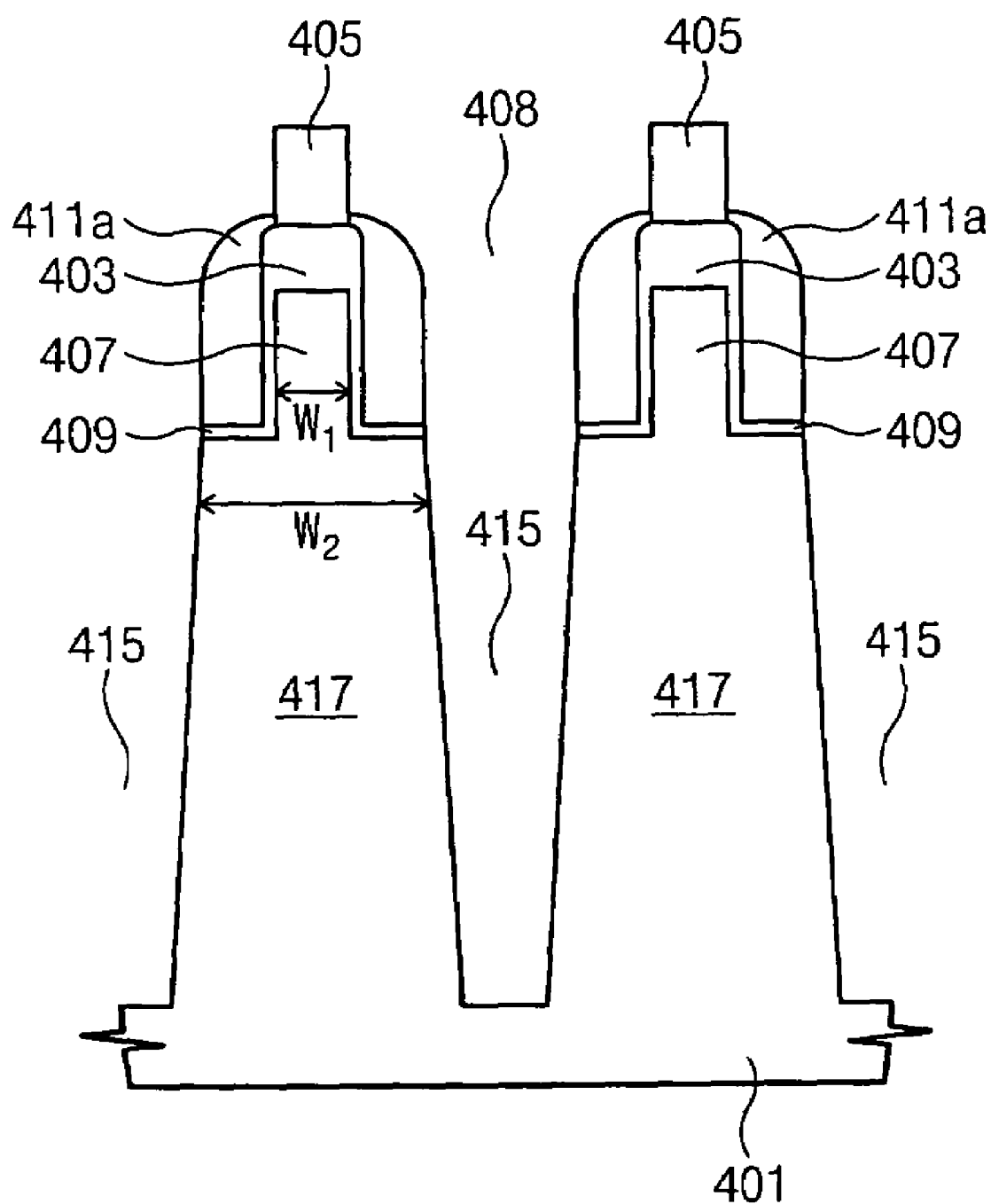

Referring to FIG. 7E, the second insulating layer and the semiconductor substrate exposed by the floating gate pattern 411a are etched back to form a trench 415 for a device isolation. As a result, a second prominence 417 of which an upper width (w2) is greater than a width (w1) of the first prominence 407 is formed integrated with the first prominence 407. The second prominence 417 may be formed such that its width (w2) gradually increases as it extends to a lower side. In other words, in some embodiments, the sidewalls of the second prominence 417 are oblique. Accordingly, a step coverage of a device isolation layer to be formed in a subsequent process may be enhanced.

Both sidewalls of the first prominence 407 and the upper surface of the second prominence 417 exposed at both sides of the first prominence 407 are covered with the floating gate pattern 411a so that they can be protected during the etch process to form the trench 415.

Figure 7F:
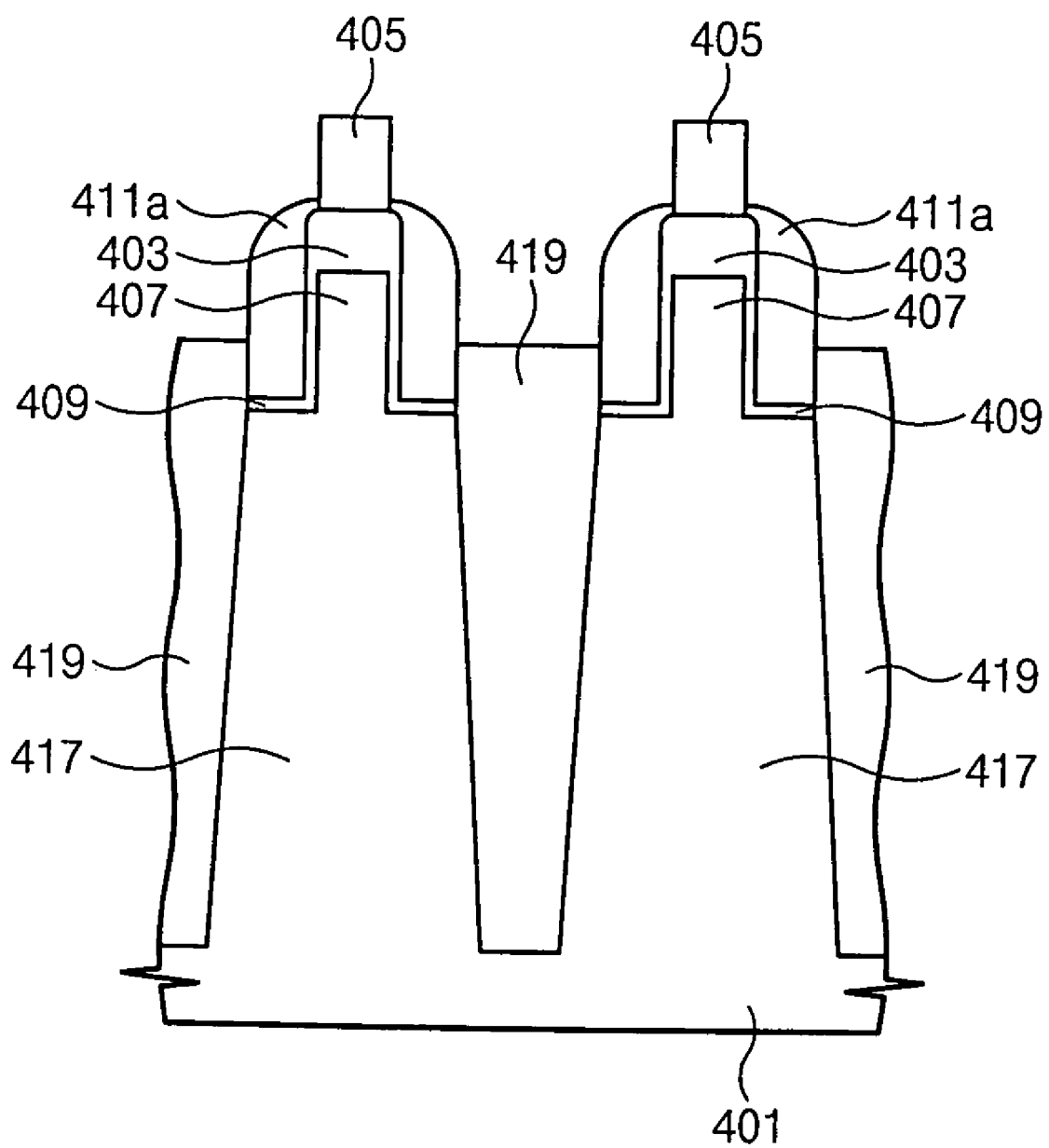

Referring to FIG. 7F, in some embodiments, the trench 415 is filled with an insulator to form a device isolation layer 419. In some embodiments, the device isolation layer 419 is formed such that its upper surface is positioned higher than the upper surface of the second prominence 417. In particular, an insulator is deposited so as to fill the depression 408 and the trench 415, and is planarized until the mask pattern 405 is exposed. Continuously, an etch back process is performed to etch the planarized insulator until the floating gate pattern 411a is exposed, thereby forming a device isolation layer 419 positioned higher than the upper surface of the second prominence 417. In some embodiments, the planarizing process and the etch back process may be replaced by a one time etch back process. During the planarizing process and the etch back process of the insulator for the device isolation, the mask pattern 405 can prevent the first insulating layer 403 from being etched.

Figure 7G:
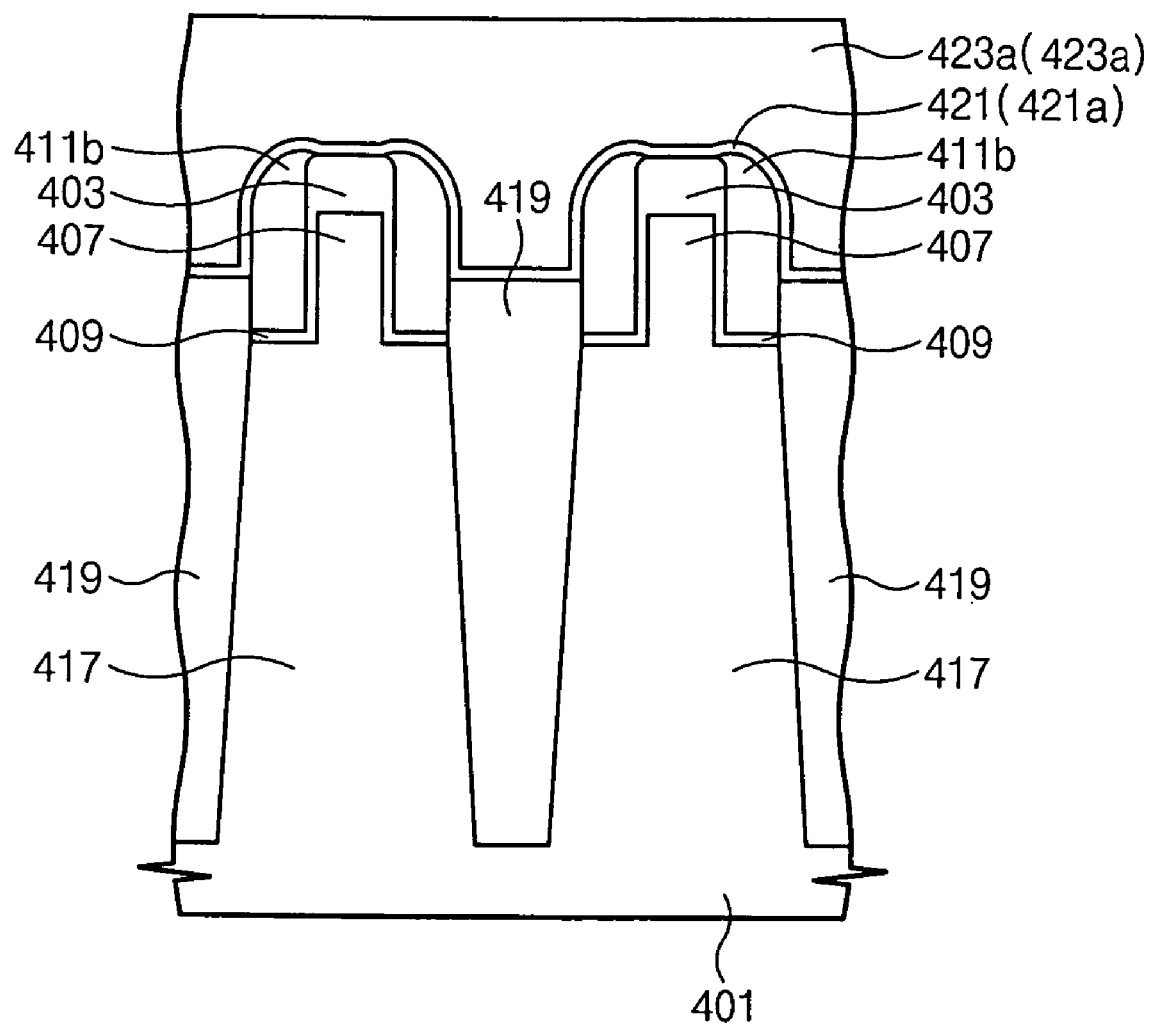

Referring to FIG. 7G, the mask pattern 405 is removed, and a third insulating layer 421 for a between-gate insulating layer and a second conductive layer 423 for a control gate are formed. The second conductive layer 432, the third insulating layer 421 and the floating gate pattern 411a are patterned by a photolithography process and an etch process to form a control gate 423a from the second conductive layer 432, a between-gate insulating layer 421a from the third insulating layer 421 and a floating gate 411b from the floating gate pattern 411.

The third insulating layer for the formation of the between-gate insulating layer 421 is formed, for example, in a multi-layer of oxide-nitride-oxide. The second conductive layer for the formation of the control gate 423 is formed of, for example, a doped polysilicon, polysilicide, or a combination of them. Thereafter, a conventional process for forming a general NAND flash memory device, for example, a process for forming a source/drain, a butting contact process, a process for forming an interlayer insulating layer, a process for forming a bit line, and the like, may be performed.

In methods of forming non-volatile memory devices according to embodiments of the invention described above, both sidewalls of the first prominence 407 and the upper surface of the second prominence 417 can form a width of an active region. Accordingly, the efficiency of the programming/erase operation may be enhanced and a current amount may increase during the read operation.

Also, in some embodiments, the trench 415 for the device isolation is formed on the first prominence 307 after the floating gate pattern 411a is formed, and the device isolation layer 419 is formed in self-alignment with the floating gate pattern 411a. Accordingly, both sidewalls of the first prominence 407 may be protected during the etch process for forming the trench 415.

Also, in some embodiments, the first insulating layer 403 is used as a gate oxide for a high voltage transistor. In other words, when a first insulating layer is formed on a cell array region where the non-volatile memory device is formed, the first insulating layer at the same time may be formed on a periphery circuit region and may be used as a gate oxide for a high voltage transistor. Accordingly, a separate mask process for the gate oxide of the high voltage transistor may not be needed.

In embodiments of FIGS. 6A-6G, although the floating gate pattern 311a is formed by a photolithography process and an etch process, it may be formed by a planarizing process, which will be described with reference to FIGS. 8A to 8E.

Figure 8A:
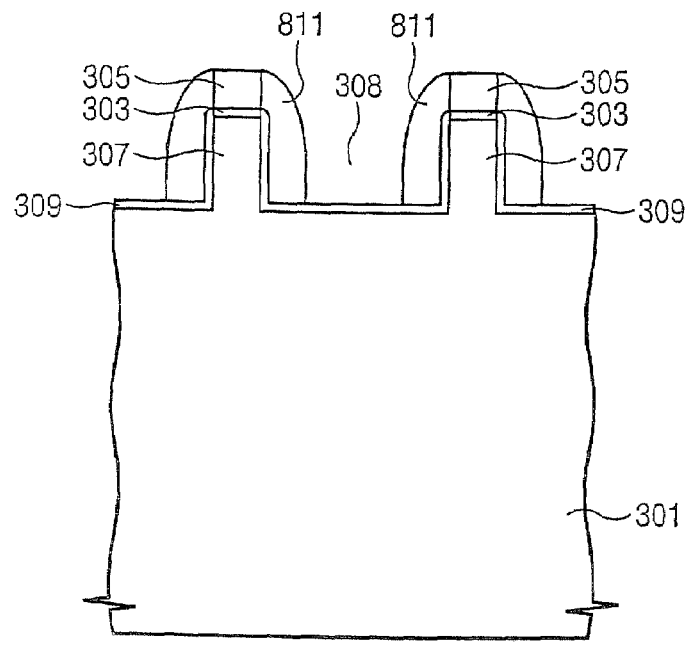
FIGS. 8A to 8E are cross-sectional views of semiconductor substrates for illustrating methods of forming a non-volatile semiconductor device of FIG. 3 according to yet other embodiments of the present invention.

First, referring to FIG. 8A, after the process described in relation to FIG. 6A is performed, a second insulating layer 309 is formed on both sidewalls of the first prominence 307. The second insulating layer 309 may be formed of a thermal oxide. Alternatively, the second insulating layer 309 may be formed by CVD. In the case of CVD, the second insulating layer is formed even on the mask pattern 305. Thereafter, a sacrificial silicon nitride layer is formed and is then etched back to form a sacrificial silicon nitride space 811 on the depression and prominence structure and both sidewalls of the mask pattern.

Figure 8B:
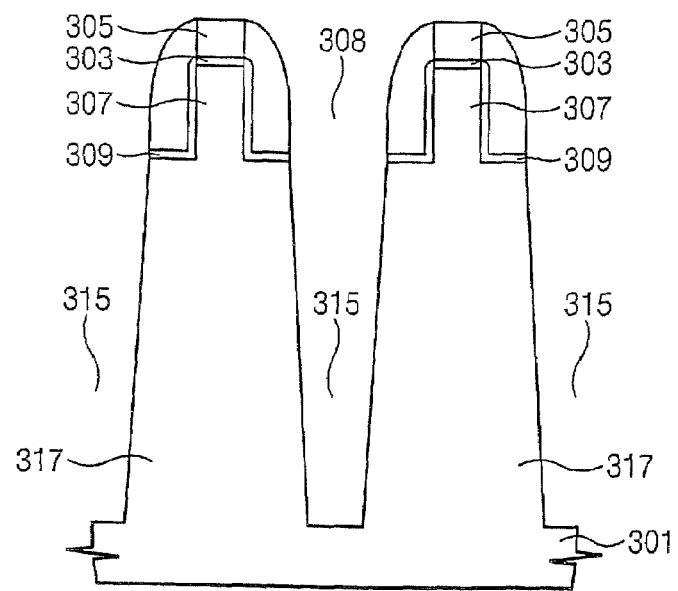

Referring to FIG. 8B, the second insulating layer and the semiconductor substrate exposed at a bottom of the depression 308 are etched using the sacrificial silicon nitride spacer 811 as an etch mask to form a trench 315 for a device isolation. As a result, a second prominence 317 is formed continuously with the first prominence 307.

Figure 8C:
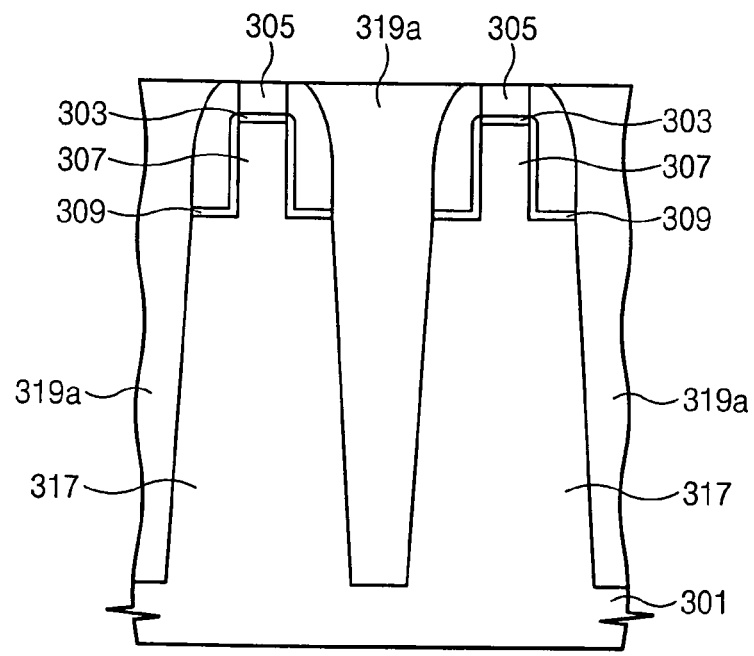

Referring to FIG. 8C, in some embodiments, an insulator is formed for the device isolation to fill the trench 315 and the depression 308 and is then planarized or etched back until the mask pattern 305 and the sacrificial silicon nitride spacer 811 is exposed, to form a planarized insulating layer 319a for the device isolation. At this time, while the insulator is planarized or etched back, it may be over-etched such that the mask pattern 305 and the sacrificial silicon nitride space 811 are partially removed.

Figure 8D:
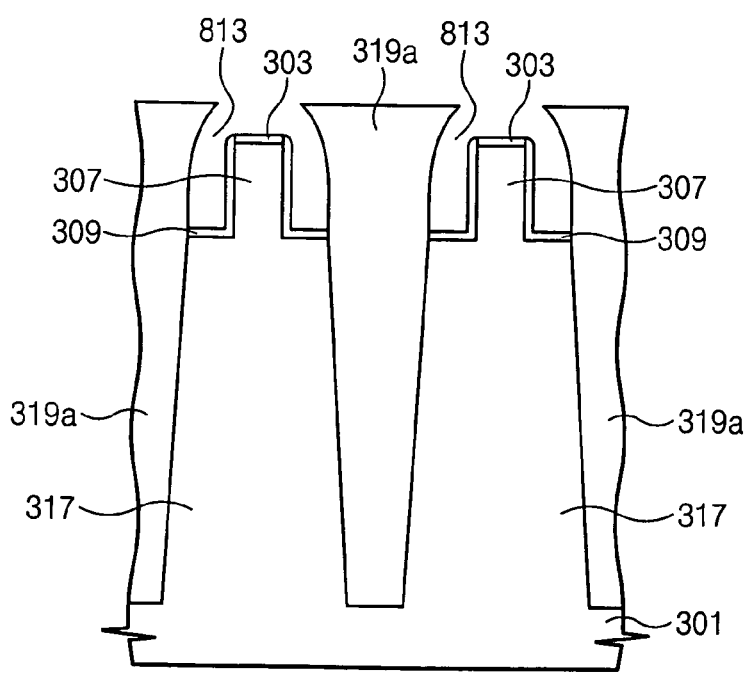

Referring to FIG. 8D, the silicon nitride mask pattern 305 and the sacrificial silicon nitride spacer 811 are removed to form an opening 813 exposing the first insulating layer 303 on the first prominence 307 and the second insulating layer 309 on the both sidewalls of the first prominence 307.

Figure 8E:
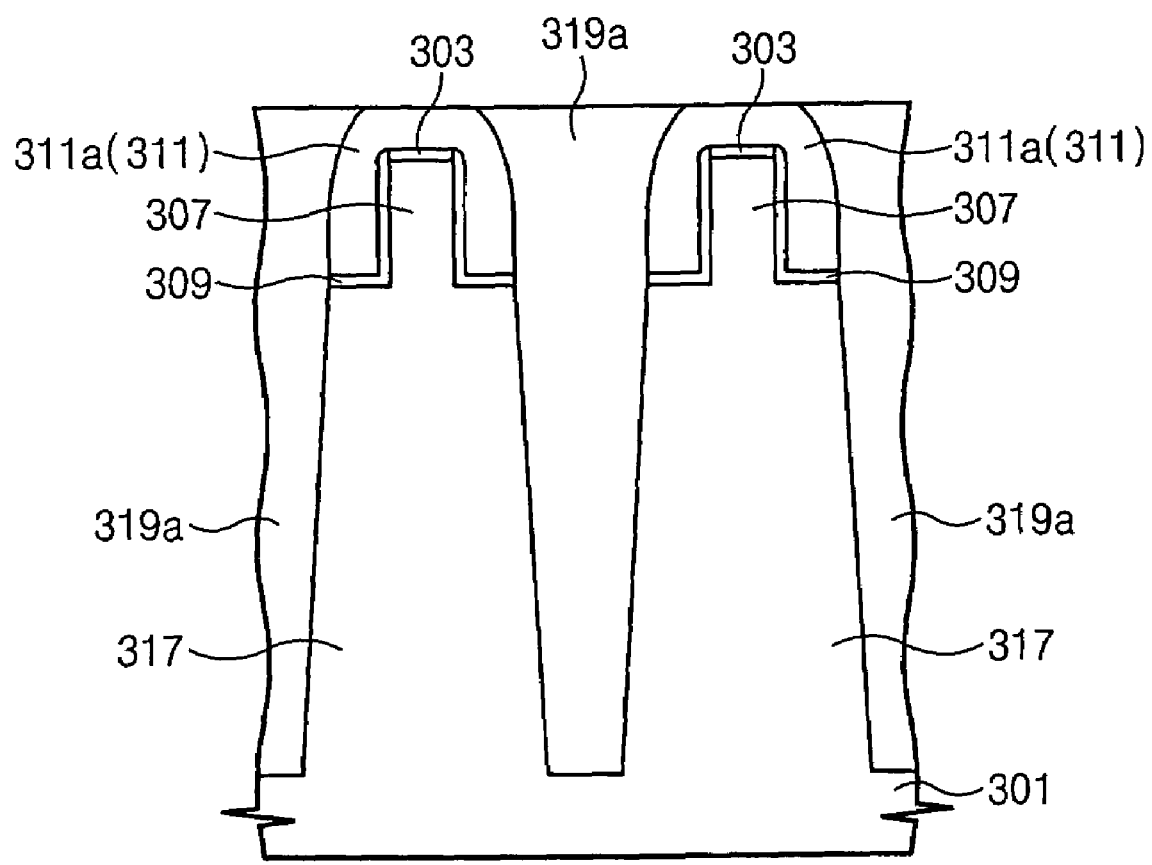

Referring to FIG. 8E, in some embodiments, so as to fill a site 813 from which the silicon nitride 305 and the sacrificial silicon nitride spacer 811 are removed, a first conductive layer 311 for a floating gate is formed on the planarized insulating layer 319a for the device isolation. The first conductive layer 311 is planarized until the planarized insulating layer 319a for the device isolation is exposed. As a result, a floating gate pattern 311a is formed on the upper surface and both sidewalls of the first prominence 307 and the upper surface of the second prominence 317. Thereafter, the planarized insulating layer 319a for the device isolation is etched to expose sidewalls of the floating gate pattern 311a. As a result, a structure shown in FIG. 6F may be formed. Thereafter, a third insulating layer for a between-gate insulating layer and a second conductive layer for a control gate are formed and a photolithography process and an etch process are performed. In the etch process, the second conductive layer, the third insulating layer and the floating gate pattern 311a are etched.

In the aforementioned embodiments, if a pad oxide 303 is formed thick, the tunneling of charges occurs through both sidewalls of the first prominence and the first insulating layer 309 on the upper surface of the second prominence, but does not occur through the pad oxide 303 on the upper surface of the first prominence.

As described above, according to various embodiments of the present invention, an active region is made in the form of a depression and prominence to increase the width of the active region, so that in the case of a non-volatile memory device, on-cell current can be increased or maximized and in the case of a MOSFET, a current driving capability can be increased or maximized.

Also, in the process of forming a trench for the device isolation, the active region having the depression and prominence structure can be protected by a floating gate pattern.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
    a second prominence that protrudes from a semiconductor substrate and a first prominence that protrudes from an upper surface of the second prominence, the first prominence having a lower width that is narrower than a width of an upper surface of the second prominence;
    a first insulating layer on an upper surface of the first prominence;
    a second insulating layer on both sidewalls of the first prominence and the upper surface of the second prominence exposed at both sides of the first prominence;
    a first conductive layer on the first and second insulating layers; and
    a device isolation layer covering both sidewalls of the second prominence and a part of both sidewalls of the first conductive layer.

2. The semiconductor device of claim 1, further comprising:
    a third insulating layer on the first conductive layer and the device isolation layer; and
    a second conductive layer on the third insulating layer,
    wherein the first insulating layer is of same thickness as the second insulating layer, and
    wherein tunneling of charges occurs through the first insulating layer on the upper surface of the first prominence and the second insulating layer on both sidewalls of the first prominence and the upper surface of a second prominence outside the first prominence.

3. The semiconductor device of claim 2, wherein the first conductive layer does not extend on the upper surface of the first prominence but extends on both sidewalls of the first prominence in the form of a spacer,
    the first insulating layer is thicker than the second insulating layer such that the charges are tunneled through the second insulating layer,
    the first and second insulating layers have corresponding thicknesses such that both sidewalls and the upper surface of the first prominence serve as a channel, and
    the third insulating layer extends on the first insulating layer, the first conductive layer and the device isolation layer.

4. The semiconductor device of claim 1, wherein the first and second insulating layers comprise thermal oxide layers having same thickness, and both sidewalls and the upper surface of the first prominence and the upper surface of the second prominence outside the first prominence serve as a channel.

5. The semiconductor device of claim 1, wherein the first and second insulating layers are of same thickness and respectively comprise a multilayer structure including an oxide layer, a nitride layer and an oxide layer sequentially stacked, and charges are tunneled through the first insulating layer on the upper surface of the first prominence and the second insulating layer on both sidewalls of the first prominence and the upper surface of a second prominence outside the first prominence.

6. The semiconductor device of claim 1, wherein the first insulating layer has a multilayer structure including an oxide layer and a nitride layer sequentially stacked such that the both sidewalls of the first prominence and the upper surface of the second prominence outside the first prominence serve as a channel.

7. The semiconductor device of claim 1, wherein the first prominence has a constant width and the second prominence has a width that increases as it extends to a lower side.

8. A semiconductor device comprising:
    a semiconductor fin in a semiconductor substrate;
    an insulated first conductive layer on sidewalls of the semiconductor fin and on a surface of the semiconductor substrate adjacent the semiconductor fin that defines a channel region or tunneling region in the sidewalls of the semiconductor fin adjacent the insulated first conductive layer and in the surface of the semiconductor substrate adjacent the insulated first conductive layer;
    a trench in the semiconductor substrate immediately outside the insulated first conductive layer;
    an isolation layer in the trench; and
    a second conductive layer on the insulated first conductive layer and on the isolation layer in the trench.

9. The device of claim 8, wherein the second conductive layer comprises an insulated second conductive layer.

10. A semiconductor device comprising:
    a second prominence that protrudes from a semiconductor substrate and a first prominence that protrudes from an upper surface of the second prominence, the first prominence having a lower width that is narrower than a width of the upper surface of the second prominence;
    a first insulating layer on an upper surface of the first prominence;
    a second insulating layer on both sidewalls of the first prominence and the upper surface of the second prominence exposed at both sides of the first prominence;
    a first conductive layer on sidewalls of the first prominence and interposing the second insulating layer therebetween;
    a device isolation layer covering both sidewalls of the second prominence and a part of both sidewalls of the first conductive layer;
    a third insulating layer on the first conductive layer, on the device isolation layer and on the first insulating layer; and
    a second conductive layer on the third insulating layer,
    wherein the first insulating layer is thicker than the second insulating layer such that tunneling of charges occurs through the second insulating layer.

* * * * *